United States Patent [19]

Frosien et al.

[11] Patent Number: 4,785,176
[45] Date of Patent: Nov. 15, 1988

[54] ELECTROSTATIC-MAGNETIC LENS FOR PARTICLE BEAM APPARATUS

[75] Inventors: Juergen Frosien, Ottobrunn; Erich Plies, Munich, both of Fed. Rep. of Germany

[73] Assignee: Siemens Aktiengesellschaft, Berlin and Munich, Fed. Rep. of Germany

[21] Appl. No.: 30,964

[22] Filed: Mar. 27, 1987

[30] Foreign Application Priority Data

Apr. 24, 1986 [DE] Fed. Rep. of Germany ....... 3613915

[51] Int. Cl.$^4$ .............................................. H01J 49/06
[52] U.S. Cl. .................... 250/396 ML; 250/396 R; 250/310; 250/305
[58] Field of Search ........... 250/396 R, 396 ML, 310, 250/305

[56] References Cited

U.S. PATENT DOCUMENTS 4,419,581 12/1983 Nakagawa .................... 250/396 ML
4,546,258 10/1985 Chisholm .................... 250/396 ML
4,623,836 11/1986 Frosien et al. ................. 324/73 PC

OTHER PUBLICATIONS

Record of the IEEE 9th Annual Symposium on Electron, Ion, and Laser Beam Technology, Berkeley, May 9-11, 1967, Pease, Editor.

U.S. Copending application Ser. No. 023,857 filed Mar. 9, 1987.

The Encyclopedia of Physics, Second Edition, edited by R. M. Besancon.

Primary Examiner—Carolyn E. Fields
Assistant Examiner—John A. Miller

[57] ABSTRACT

An electrostatic-magnetic lens is provided having either a symmetrical or asymmetrical magnetic lens which is overlaid with an electrostatic immersion lens. One electrode of the immersion lens is formed as a hollow cylinder, which is within an upper pole piece of the magnetic lens concentrically relative to the axis of symmetry thereof and extending into the region of the pole piece gap. The lower pole piece of the magnetic lens is preferably at a ground potential and clad with the beam guiding tube for protection against contamination and forming the lower electrode of the electrostatic immersion lens.

16 Claims, 2 Drawing Sheets

ELECTROSTATIC-MAGNETIC LENS FOR PARTICLE BEAM APPARATUS

BACKGROUND OF THE INVENTION

1. Field of the Invention

The present invention relates generally to an electrostatic-magnetic lens for a particle beam apparatus.

2. Description of the Related Art

Particle beam devices are currently being used in all areas of development and manufacture of microelectronic components. The various manufacturing stages of integrated circuits are monitored, masks and wafers are inspected, and micro-structures are generated by electron beam lithography, all with particle beam devices.

Modified scanning electron microscopes that are equipped with retarding field spectrometers and fast beam blanking systems have obtained a particular significance in detecting logic and design errors in large scale integrated circuits, especially during the development phase. For example, the modified scanning electron microscopes are used to mesure the time dependence at selected nodes in the circuit. To avoid charging and/or damaging the radiation sensitive specimens, the electron optical devices are predominantly operated at low accerlating voltages of between 0.5 and 5 kV, so that it is no longer possible to produce high resolution investigations as with conventional scanning electron microscopes.

Therefore, all areas of the semiconductors industry have an increasing need for a high performance, low voltage scanning electron microscope which provides fast and high resolution investigations of microelectronic components.

At low acceleration voltages, the resolution of a scanning electron microscope is determined by the beam diameter d on the specimen, which in turn is essentially defined by the Coulomb repulsion of the electrons, also known as the Boersch effect, which opposes focusing of the beam. Resolution is also hindered by the axial chromatic aberrations of the imaging lenses which increases with the chromatic aberration coefficient $C_F$ and, for a constant width of the energy distribution for the electrons, increases with decreasing primary energy. The beam diameter d is in accordance with the following equation $$d=(d_O^2+d_F^2)^{\frac{1}{2}} \quad (1),$$

where the probe diameter d defines the resolution and $d_O$ denotes the geometrical optical probe diameter expanded by the Coulomb repulsion of the electrons between the beam source and the specimen, in other words, the lateral Boersch effect, and $d_F$ denotes the diameter of the chromatic aberration disk produced by the chromatic aberration, which by the relationship $$d_F = C_F \cdot \alpha \cdot \Delta U/U \quad (2)$$

is dependent on the beam aperture, on the chromatic aberration coefficient $C_F$ of the lens, on the primary energy eU, and on the width of the energy distribution $e\Delta U$ of the electrons. Therefore, it is only possible to improve the resolution by reducing the negative influences of the electron-electron interaction (the energetic Boersch effect which influences the energy width $e\Delta U$ and the lateral Boersch effect which influences the probe diameter (d) and the chromatic aberration constant $C_F$ of the lenses used.

In the publication by R. F. W. Pease "Low Voltage Scanning Electron Microscopy", Record of the IEEE 9th Annual Symposium on Electron, Ion and Laser Beam Technology, Berkeley, 9–11 May 1967, pp. 176–187, a scanning electron microscope is disclosed in which primary electrons are initially accelerated to high kinetic energies and are subsequently decelerated to the desired low final energy in an retarding field established immediately above the specimen. By measuring the beam cross section on the specimen, it can be shown that the objective lens of the disclosed arrangement in the retarding mode exhibits significantly smaller chromatic and spherical aberration constants than a magnetic single lens given conventional operation without a retarding field.

SUMMARY OF THE INVENTION

An object of the present invention is to provide a lens for particle beam devices for decelerating high energy particles to a desired final energy which exhibits smaller aberrations than conventional magnetic lenses. This and other objects are inventively achieved in an electrostatic-magnetic lens having a magnetic lens generating a nearly rotational symmetric magnetic field and an electrostatic immersion lens generating a nearly rotational symmetric electrical field and including two electrodes at different potentials which are disposed within the magnetic lens.

An advantage obtainable by the present invention is that the particle probes having small beam cross sections can be generated even for high beam currents and low accelerating voltages.

Preferred developments and improvements of the invention include one pole piece of the magnetic lens forming an electrode of the electrostatic immersion lens, at least one of the electrodes of the electrostatic immersion lens in the shape of a hollow cylinder concentrically disposed within the upper pole piece of the magnetic lens, a second electrode in the form of a hollow cylinder provided within a hollow cylindrical electrode, a diaphragm within one of the electrodes that is conductively connected to the electrode, the diaphragm being an aperture diaphragm and being at the end of one of the electrodes, a beam guiding tube lining the lower pole piece of the magnetic lens and the magnetic lens being either symmetrical, asymmetrical, or conical.

DESCRIPTION OF THE PREFERRED EMBODIMENTS

Figure 1:
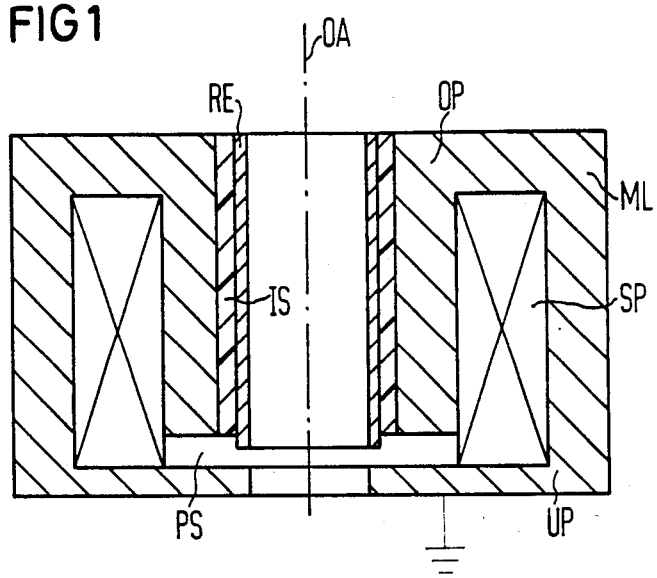
FIG. 1 is a vertical cross section through an electrostatic-magnetic lens according to the principles of the present invention.

An electrostatic-magnetic lens is shown in FIG. 1 for use in a particle beam device, such as a scanning electron microscope. A scanning electron microscope is shown in the above-identified publication from the Record of the IEEE 9th Annual Symposium on Electron, Ion and Laser Beam Technology, incorporated herein by reference.

The electrostatic-magnetic lens shown in FIG. 1 is formed of a symmetrical or an asymmetrical magnetic lens ML which is overlaid by an electrostatic immersion lens. To achieve the smallest possible focal lengths, the magnetic flux generated with the assistance of an excitation coil SP is conducted through pole pieces UP and OP and is concentrated into a small spatial region around an axis of symmetry OA of the system. The magnetic field is rotational symmetric around the symmetric axis OA and achieves its maximum strength in a pole piece gap PS.

In the illustrated exemplary embodiment, one electrode of the electrostatic immersion lens is in the form of a hollow cylinder RE which, together with a cylindrical insulator IS, is disposed in the upper pole piece OP of the magnetic lens ML. The cylindrical electrode RE is concentrically disposed relative to the axis of symmetry OA and extends into the region of the pole piece gap PS. A second electrode is formed by the lower pole piece UP and is preferably, although not necessarily, connected to ground.

Figure 2:
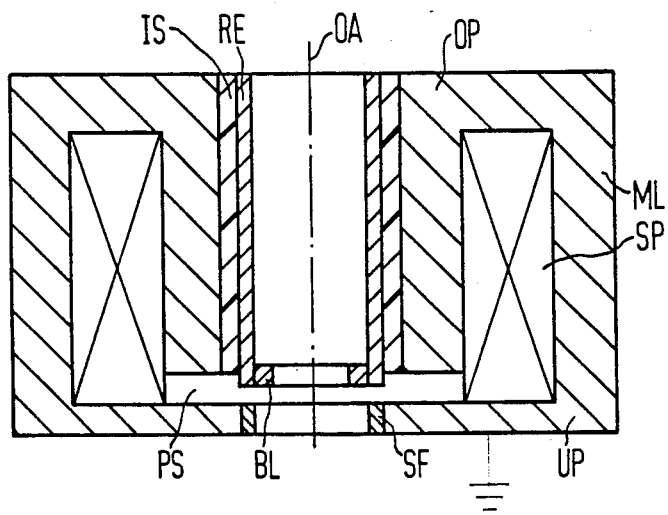
FIG. 2 is a vertical cross section through a second embodiment of an electrostatic-magnetic lens of the invention.

In FIG. 2, a second embodiment of an electrostatic-magnetic lens is shown including the lower pole piece UP of the magnetic lens ML being clad with a beam guiding tube SF of either magnetic or nonmagnetic material for protection against contamination. The lower pole piece UP is preferably connected to ground potential and forms the lower electrode of the electrostatic immersion lens in accordance with the invention. A rotational symmetric electrical retarding field is built up within the magnetic lens ML whenever the cylindrical electrode RE is connected to a positive potential in comparison to that of the lower pole piece UP, and more particularly, in comparison to the potential of an anode of the particle beam generator (not shown).

The imaging properties of the particle-optical unit composed of the electrostatic immersion lens and the magnetic lens ML are essentially defined by voltages applied to the electrodes as well as the dimensions of the electrodes and by the magnetic field strength of the pole piece gap PS. It is therefore definitely not necessary that the cylindrical electrode RE and the opening in the lower pole piece UP have the same diameter.

Figure 3:
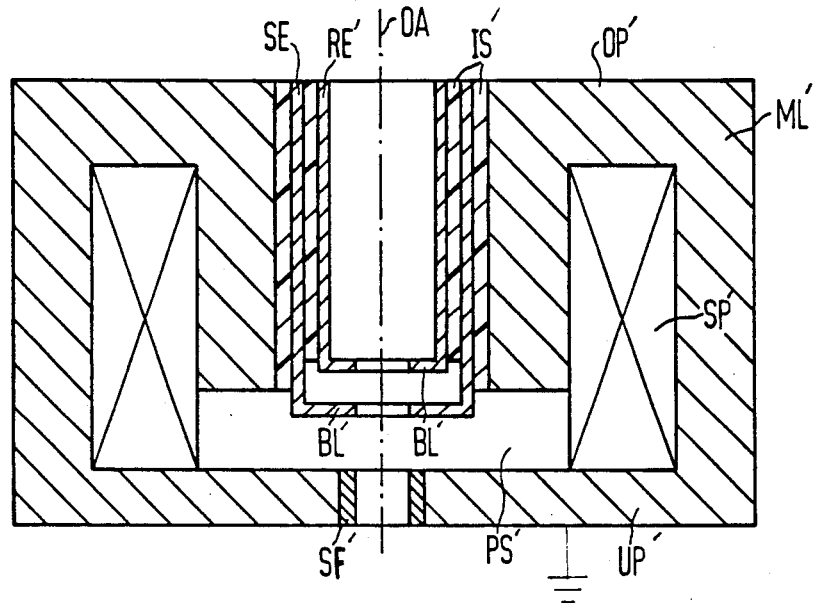
FIG. 3 is a vertical cross section showing a third embodiment of the inventive electrostatic-magnetic lens.

On the contrary, the position of the cylindrical electrode RE within the magnetic lens ML, its diameter and its spacing from the lower pole piece UP, is adapted to the required particle-optical properties of the overall system. Thus, the focal length of the electrostatic immersion lens is varied with the assistance of a circular aperture diaphragm BL which is disposed within the cylindrical electrode RE, as shown in FIG. 3, or which terminates in the region of the pole piece gap PS, as shown in FIG. 2. In FIG. 3, a continuous variation of the focal length is possible when two coaxially disposed cylindrical electrodes RE' and SE of different focal lengths are disposed within an upper pole piece OP' and the outer cylindrical electrode SE acts as a control electrode by being charged with a suitable voltage. Each of the cylindrical electrodes RE' and SE, in one embodiment, are terminated by a circular apertured diaphragm BL'.

Due to the electrical retarding field superimposed on the focusing magnetic field, the electrostatic-magnetic lens of the invention exhibits noticeably smaller spherical and chromatic aberration constants than do known magnetic lenses. Thus, the aberration constants of the composite system essentially defined by the difference in potential between the cylindrical electrode RE and the lower pole piece UP are reduced by about a factor of ten in comparison to the aberration constants of a magnetic lens when the particles are decelerated in the retarding field of the immersion lens to one-tenth of their primary energy. The lenses of the invention also exhibits an advantage in that their particle-optical properties are easily calculated and are readily realized in practice due to the excellent centerability of the electrical and magnetic lens.

Figure 4:
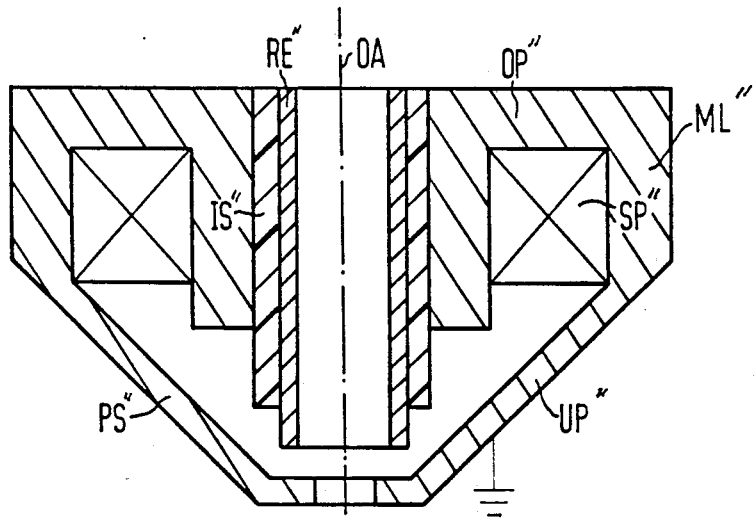
FIG. 4 is a vertical cross section showing yet another embodiment of the present electrostatic-magnetic lens.

Referring now to FIG. 4, an electrostatic-magnetic lens including a conical magnetic lens ML'' is shown in which primed reference characters indicate substantially similar elements relative to FIGS. 1 through 3. Conical objective lenses are used, for example, in scanning electron microscopes so that it is possible to image and investigate large specimen at small working distances. As a consequence of the form of the pole pieces OP'' and UP'', the conical magnetic lens has a large pole piece gap PS'' and, thus, a comparatively long focal length. This leads to large aberrations which increase with the focal length. As a result of the inventive arrangement of a cylindrical electrode RE'' at positive potential within the upper pole piece OP'', the imaging properties of the particle-optical unit having a conical magnetic lens ML'' and an electrostatic immersion lens are noticeably improved in comparison to those using a conical single lens. This improvement in the imaging properties is achieved by the afore-described reduction of aberration constants and by the shift of the principal planes of the conical magnetic lenses ML'' in the direction of the specimen. The shortening of the focal length associated with the magnetic lens ML'' ($C_F \sim$ focal length) causes lower aberrations. In the exemplary embodiment, the lower pole piece UP'' is preferably connected to ground potential to form one electrode of the electrostatic immersion lens.

The electrostatic-magnetic lenses of the present invention are advantageously used in scanning particle microscopes and particularly in scanning electron microscopes. The Boersch effect in such microscopes limits the resolution, particularly at low accelerating voltages and the conventional lens systems used therein generate excessively high aberrations. Since the influence of the lateral Boersch effect on the probe diameter decreases at high kinetic energies, but the width of the energy distribution of the primary electrons, particularly in the beam generator, noticeably increases as a consequence of the energetic Boersch effect, the electrons should advantageously pass a first beam crossover, or source crossover (not shown), at low energies of, for example, 2 keV. The electrons are subsequently accelerated to high energies, of for example, 10 keV and are decelerated to the desired low final energy of, for example, 1 keV, shortly before they reach the specimen. The deceleration and focusing of the primary electrons advantageously occurs with the use of an electrostatic-magnetic lens of the present invention which in place of a conventional condenser lens or objective lens of an electron optical column. The cylindrical electrode RE lies at anode potential, such as 9 kV, given an assumed cathode potential of $-1$ kV, an acceleration of the primary electrons to 10 keV and a desired final energy of the primary electrons of 1 keV. Typical dimensions of the electrostatic-magnetic lens are:

A diameter of 6 mm and a gap of 3 mm of the cylindrical electrodes and a diameter of 10 mm of the upper and 6 mm of the lower pole piece and a gap of 4 mm of the magnetic lens.

Although other modifications and changes may be suggested by those skilled in the art, it is the intention of the inventors to embody within the patent warranted hereon all changes and modifications as reasonably and properly come within the scope of their contribution to the art.

We claim as our invention:

1. An electrostatic-magnetic lens for a particle beam apparatus, comprising:
    a magnetic lens having an upper and a lower pole piece;
    an electrostatic immersion lens superimposed on said magnetic lens and comprising:
        a first electrode arranged in a region of said upper pole piece and means for applying a first potential to said first electrode, and
        a second electrode and means for charging said second electrode with a second potential to generate an electrical field in said electrostatic immersion lens so that a particle beam in said electrical field is decelerated from a first energy to a second lower energy.

2. An electrostatic-magnetic lens as claimed in claim 1, wherein at least one of said first and second electrodes of said electrostatic immersion lens is of a hollow cylindrical shape, and
    said hollow cylindrical shaped one of said electrodes being disposed concentrically to said axis of symmetry in said upper pole piece.

3. An electrostatic-magnetic lens as claimed in claim 1, wherein both of said first and second electrodes has the shape of a hollow cylinder, and further comprising:
    a hollow cylindrical control electrode disposed coaxially about said one of said first and second electrodes.

4. An electrostatic-magnetic lens as claimed in claim 1, further comprising:
    a diaphragm disposed within at least one of said electrodes and being conductively connected to said at least one electrode.

5. An electrostatic-magnetic lens as claimed in claim 1, wherein at least one of said electrodes is terminated by an apertured diaphragm.

6. An electrostatic-magnetic lens as claimed in claim 1, further comprising:
    a beam guiding tube lining said upper pole piece of said magnetic lens.

7. An electrostatic-magnetic lens as claimed in claim 1, wherein said magnetic lens is a symmetrical lens.

8. An electrostatic-magnetic lens as claimed in claim 1, wherein said magnetic lens is an asymmetrical lens.

9. An electrostatic-magnetic lens as claimed in claim 1, wherein said magnetic lens is a conical lens.

10. An electrostatic-magnetic lens as claimed in claim 1, wherein said second electrode of said immersion lens is said lower pole piece of said magnetic lens.

11. An electrostatic-magnetic lens as claimed in claim 1, further comprising:
    a hollow cylinder part cladding said lower pole piece, said hollow cylinder part being said second electrode of said immersion lens.

12. An electrostatic-magnetic lens for a particle beam apparatus, comprising:
    a magnetic lens having an upper and a lower pole piece;
    an electrostatic immersion lens superimposed on said magnetic lens and comprising:
        a first electrode arranged in a region of said upper pole piece and means for applying a first potential to said first electrode, and
        a second electrode arranged in a region of said lower pole piece and means for applying a second potential to said second electrode to generate a field in said immersion lens so that a particle beam is decelerated from a first energy to a second lower energy.

13. An electrostatic-magnetic lens for a particle beam apparatus, comprising:
    a magnetic lens for generating a magnetic flux and including:
        an excitation coil,
        an upper pole piece, and
        a lower pole piece spaced from said upper pole piece by a pole piece gap,
        said magnetic lens being symmetrical about an axis of symmetry;
    an electrostatic immersion lens for generating an electrical retarding field and including:
        a hollow cylindrical electrode disposed within said upper pole piece and symmetrical about said axis of symmetry,
        said lower pole piece forming a second electrode of said immersion lens and connected to a predetermined potential;
        a hollow cylindrical part cladding said lower pole piece; and
        a cylindrical insulator disposed between said upper pole piece of said magnetic lens and said cylindrical electrode of said immersion lens.

14. An electrostatic-magnetic lens as claimed in claim 13, wherein a portion of said cylindrical electrode of said immersion lens extends adjacent said pole piece gap.

15. An electrostatic-magnetic lens as claimed in claim 13, further comprising:
    a beam guiding tube disposed within said lower pole piece.

16. An electrostatic-magnetic lens as claimed in claim 13, further comprising:
    at least one apertured diaphragm disposed within said cylindrical electrode of said immersion lens and symmetrical about said axis of symmetry.

* * * * *